United States Patent

Celotta et al.

[11] Patent Number: 6,165,688
[45] Date of Patent: Dec. 26, 2000

[54] METHOD OF FABRICATING OF STRUCTURES BY METASTABLE ATOM IMPACT DESORPTION OF A PASSIVATING LAYER

[75] Inventors: Robert J. Celotta, Darnestown; Jabez J. McClelland, Bethesda; Rajeev Gupta, Gaithersburg, all of Md.; Harold Craighead, Ithaca, N.Y.

[73] Assignee: The United States of America, as represented by the Secretary of Commerce, Washington, D.C.

[21] Appl. No.: 08/854,638

[22] Filed: May 12, 1997

Related U.S. Application Data

[60] Provisional application No. 60/017,774, May 15, 1996.

[51] Int. Cl.[7] .................................................. G03F 7/00
[52] U.S. Cl. ......................... 430/296; 430/313; 438/798
[58] Field of Search ..................... 430/269, 296, 430/311, 313, 314, 315, 322, 323, 324; 427/458; 216/48, 65, 66; 438/38, 712, 707, 798

[56] References Cited

U.S. PATENT DOCUMENTS

| | | | |
|---|---|---|---|
| 4,331,504 | 5/1982 | Chuang et al. | 156/635 |
| 4,615,756 | 10/1986 | Tsujii et al. | 156/345 |
| 4,828,874 | 5/1989 | Hiraoka et al. | 427/53.1 |
| 4,936,940 | 6/1990 | Kawasumi et al. | 156/345 |
| 4,937,094 | 6/1990 | Doehler et al. | 427/38 |
| 4,960,495 | 10/1990 | Mori et al. | 204/129.3 |
| 5,024,724 | 6/1991 | Hirono et al. | 156/643 |
| 5,037,666 | 8/1991 | Mori | 427/38 |
| 5,340,684 | 8/1994 | Hayase et al. | 430/165 |
| 5,354,985 | 10/1994 | Quate | 250/234 |
| 5,360,764 | 11/1994 | Celotta et al. | 437/173 |
| 5,607,601 | 3/1997 | Loper et al. | 216/63 |
| 5,851,725 | 12/1998 | McClelland | 430/269 |

OTHER PUBLICATIONS

Physical Review B; Third Series, vol. 41 No. 6: pp. 3303–3315; Feb. 15, 1990 "Theory of spin–polarized metastable–atom–deexcitation spectroscopy: NI–He"; D.R. Penn et al.

Science; vol.262; pp. 877–880; Nov. 5, 1993; "Laser-Focused Atomic Deposition"; J.J. McClelland et al.

J. Vac. Sci. Technol. B, vol. 13 No. 3; pp. 805–811 May/Jun. 1995; "Nanometer lithography on silicon and hydrogenated amorphous silicon with low energy electrons" N. Kramer et al.

Letters to Nature; Vo.l. 375–18; May, 1995; pp. 214–216; "Imaging with an atomic beam", W.G. Kaenders et al.

Science; vol. 268; Jun. 16, 1995; pp. 1590–1592; "Atomic-Scale Desorption Through Electronic and Vibrational Excitation Mechanisms", T.C. Shen et al.

Science; vol. 269; Sep. 1, 1995; pp. 1255–1257; "Microlithography by Neutral Metastable Atoms and Self–Assembled Monolayers", K.K. Berggren et al.

Experimental Methods in the Physical Sciences; vol. 29B; 1996; pp. 95–98; "Sources of Metastable Atoms and Molecules", T.J. Gay.

Optics Communications; Jan. 15, 1997; pp. 105–111; "A virtual amplitude grating for atomic optics", A.P. Chu et al.

*Primary Examiner*—Kathleen Duda
*Attorney, Agent, or Firm*—Baker & Daniels

[57] ABSTRACT

A metastable depassivation lithography process for fabricating microstructures on a surface which utilizes the energy contained in neutral metastable rare gas atoms to remove passivating atoms from selected areas of a surface. Removal of the passivating atoms in a pattern allows further chemical processing to add or remove material to the exposed areas. The neutral metastable rare gas atoms can be directed to the surface using atom optical techniques to effect a desired pattern of exposure by the atoms. Alternatively, a mask can be used to effect a desired pattern of exposure.

19 Claims, 2 Drawing Sheets

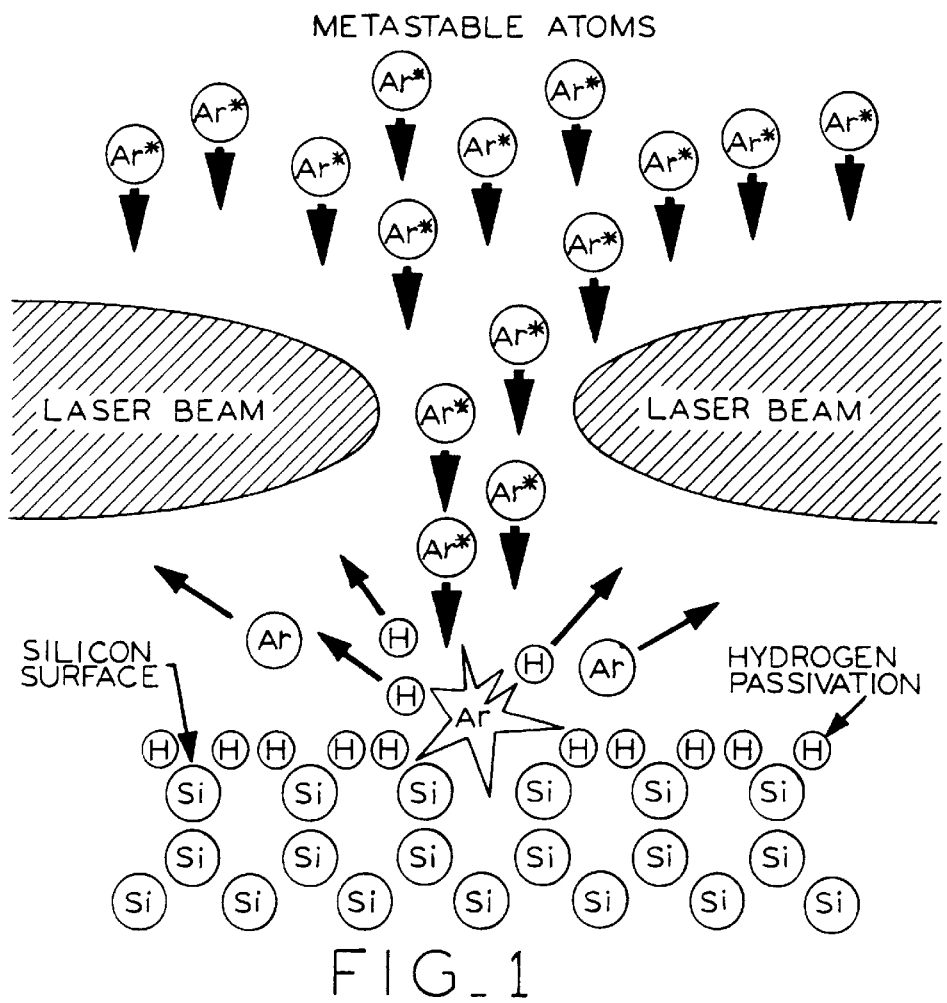
FIG_1
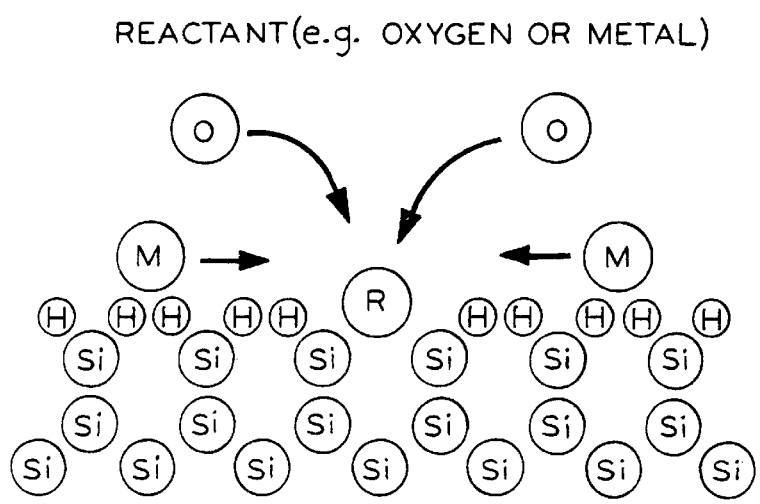
FIG_2

METHOD OF FABRICATING OF STRUCTURES BY METASTABLE ATOM IMPACT DESORPTION OF A PASSIVATING LAYER

RELATED APPLICATIONS

The present application is based upon U.S. Provisional Application Ser. No. 60/017,774, filed May 15, 1996.

TECHNICAL FIELD

The present invention relates to processes for fabricating microstructures on support surfaces. More particularly, the present invention relates to lithography processes for fabricating microstructures on support surfaces which utilizes metastable atoms to remove a passivating layer provided on the support surfaces.

BACKGROUND ART

The fabrication of various structures and structural elements on substrates or other support surfaces is fundamental to the production of all modern microelectronic devices. As commonly practiced, surface fabrication techniques typically involve some form of lithography, in combination with deposition and growth, to etch and/or grow patterned structures that become the transistors and other electronic components on a semiconductor chip.

In the push for ever-increasing performance, density, and compactness of microelectronic devices a great deal of effort has been expended in improving the resolution of existing forms of lithography and developing new methods of fabrication that have the potential for achieving higher resolution.

Optical lithography has been improved to provide shorter and shorter wavelengths. X-ray, electron and ion beam lithographies have also been explored. While many improvements have been demonstrated, it is clear that optical lithography will soon hit fundamental limits, and there is as yet no obvious alternative cost-effective technology for fabricating electronic devices with dimensions less than 100 nm. The resolution of processes using lithographic exposure by photons is simply limited by the wavelengths of the exposing radiation. Charged-particle exposure is likewise limited by the wavelengths of the exposing radiation. Charged-particle beam lithography is also limited by inherent scattering of the charged particles and the resulting spread in the exposed pattern.

One promising approach to very high resolution surface fabrication has been the use of scanning tunneling microscopy to locally desorb atoms from a passivating layer (N. Kramer et al., *J. Vac. Sci. Technol.* B 13, 805 (1995)). This technique makes use of the energy deposited in the surface by low-voltage electrons as they tunnel from a tip. This energy can break the chemical bond of a passivating atom on the surface, causing it to desorb. The reactive surface is then exposed, and further processing can lead to bonding of a variety of other atoms, such as oxygen or a metal, or the removal of substrate material through etching.

While this technique has shown the capability of near atomic resolution, it suffers from the drawback of being an inherently serial process. That is, structures must be fabricated by scanning a tip from place to place on a surface. It would be highly desirable to provide a way to expand the capabilities of this approach to include the possibility of parallel fabrication. The concept of a large array of tips has been suggested, but this idea involves a number of problems. For example, a parallel array of tips cannot match the precise atomic-scale detail required to produce a pattern or any scale quality. Moreover, controlling the uniformity of many tips is extremely difficult. In addition, the required close proximity of the tip(s) to a surface can result in damage, destruction, and/or changes in the tip(s) during scanning. Scanning probe techniques are further restricted to use in conjunction with flat surface(s).

The present invention provides an alternate approach to past and current lithography techniques which circumvents disadvantages and drawbacks associated with such prior techniques.

DISCLOSURE OF THE INVENTION

The present invention provides a lithography process which utilizes metastable atoms to remove a passivating layer from support surfaces.

The present invention further provides a metastable passivation lithography in which a beam of metastable atoms can be focused into a desired pattern and directed onto a passivation layer of a substrate to thereby desorb the passivation layer and expose a corresponding pattern of the underlying substrate.

The present invention allows fabrication of structures by removing selected areas of a passivation layer from a substrate and subsequently etching and/or depositing addition material(s) onto the exposed portions of the underlying substrate.

The present invention provides a metastable passivation lithography process which is applicable to parallel fabrication of microstructures and which is compatible with other conventional lithography processes.

BRIEF DESCRIPTION OF DRAWINGS

The present invention will be described hereafter with reference to the attached drawings which are given as non-limiting examples only in which:

FIG. 1 is a diagram showing how metastable argon atoms are directed by atom optics to impinge upon a passivated silicon substrate and removed therefrom hydrogen atoms.

FIG. 2 is a diagram which shows how an exposed area of an underlying silicon can be reacted with oxygen or metal atoms.

TECHNICAL DESCRIPTION OF THE INVENTION

Figure 3:
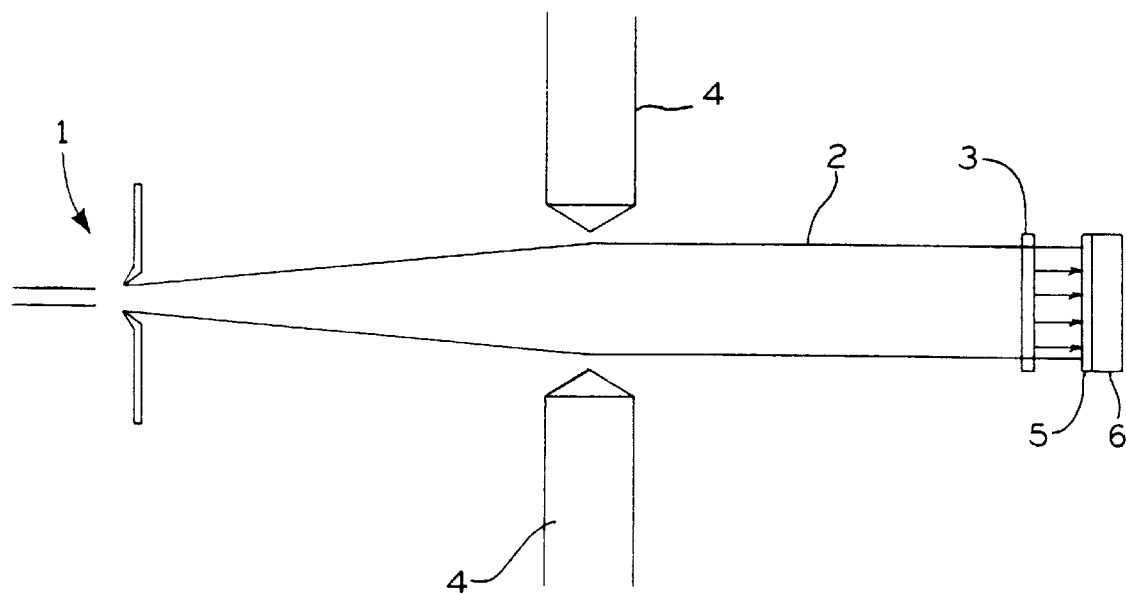
FIG. 3 is a schematic diagram which depicts an apparatus for performing metastable depassivation lithography according to one embodiment of the present invention.

The present invention involves the use of metastable atoms to physically or chemically affect selected surface regions on a substrate or other support surface. According to one embodiment, the present invention relies upon the concepts of atom optics to direct or focus the metastable atoms. The use of atom optic techniques in conjunction with the basic concepts of the present invention allows the possibility of surface structure fabrication with extremely high resolution and the possibility of parallel fabrication.

Atom optics involves manipulating a beam of neutral atoms in ways analogous to methods used to manipulate charged particles, which are in turn analogous to the techniques used in ordinary light optics. Optical elements, e.g. lenses, mirrors, gratings, collimators, beam splitters, etc., are devised so that the atoms can be focused, deflected, diffracted, trapped, or blocked and otherwise manipulated, e.g. passed through holographic phase or amplitude gratings, binary optical structures, etc., in a desired fashion. While static electric or magnetic fields can be used to modify the trajectories of neutral atoms (provided a gradient is present) ((W. G. Kaenders et al. *Nature* 375, 214 (1995)), a great deal of interest has been focused on the use of optical radiation fields, frequently in the form of a laser field.

Light or laser fields, if they are tuned near an atomic resonance frequency, can exert relatively large forces on neutral atoms. This, coupled with the fact that they can be arranged to extend over large areas, yet vary over very small distances (of order the wavelength of the light), makes laser fields ideal for extremely high resolution focusing in a parallel fabrication scenario. For example, an optical standing wave which is produced to extend over a macroscopic area, consists of a vast array of nodes, each of which has a dimension less than an optical wavelength. These nodes act as individual "lenses" that can be used to exert focusing forces on atoms passing through them. The potential resolution of these atom optic "lenses" is much less than the optical wavelength of the laser since the focal spot of a lens is generally much smaller than its dimension. The principle of atomic focusing in a standing wave has been demonstrated in the case of laser-focused atomic deposition of chromium atoms, where lines of chromium atoms as narrow as 38 nm have been deposited on a substrate (J. J. McClelland et al. *Science* 262, 877 (1993)).

In addition to focusing atoms, electromagnetic radiation fields such as laser fields, can be used to pattern an atomic beam according to another way when used in conjunction with metastable rare gas atoms. All metastable rare gases, with the exception of He, allow for the quenching their excited states through the absorption of electromagnetic radiation. This process removes the internal energy of the metastable atom, rendering it harmless surface interaction. Because the radiation field intensity can be made to vary on a sub-wavelength scale, the atoms can be selectively quenched according to desired sub-wavelength patterns which can be transferred to a surface to cause physical or chemical effects according to the present invention.

The concept of the present invention is also based in part on the interactions of metastable rare gas atoms with surfaces. It is well known that while metastable rare gases are very long-lived in free space, they immediately give up their energy when they are perturbed by the presence of a surface. There are two processes thought to play a role in this deexcitation: (1) modification of the atomic wave function by the altered boundary condition of a surface nearby breaks the selection rules that forbid a transition to the ground state and the atom decays radiatively, giving off a photon; (2) tunneling of the excited electron from the metastable state into an empty energy level in the surface leads to an Auger process in the surface, resulting in the emission of an electron.

The second of these two processes dominates in many situations and can be used to effect desorption of atoms from a surface. The electron that is emitted usually comes from a local orbital associated with the bond of a passivating atom on the surface. Removal of an electron from this orbital can very easily lead to destabilization of the bond followed by desorption. In addition to this "direct" process, there is also the possibility of promoting an electron in the bond into an anti-bonding orbital, which will also result in desorption. This can be caused by direct energy transfer from the tunneled electron, or through energy transfer from the Auger electron on its way out of the surface.

The present invention involves a process in which structures can be fabricated on a surface by metastable rare gas impact. According to one embodiment which is depicted in FIG. 1, the fabrication proceeds as follows. First, a surface from which, or upon which, a structure is to be fabricated is provided with a passivating layer. Such passivating layer comprises a thin, preferably monolayer of an element or molecules which are chemically bonded to the surface. The passivating layer is selected to be easily removed by interaction with metastable atoms. An example of an atomic layer of an element which is easily removed by interaction with metastable atoms is hydrogen which can be used to passivate a silicon substrate. In this example, the hydrogen protects the underlying silicon substrate because it is highly resistant to chemical reaction, such as oxidation, and from contamination.

Once the passivating layer is provided, metastable atoms are allowed to impact the surface in a desired pattern. Such desired pattern can be generated and controlled by a variety of atom optic techniques or mechanical means, as described above. As the metastable atoms impact the passivating layer they lose their internal energy to the surface in the region where they hit as depicted in FIG. 1.

In the case of a passivating layer which is made from an element or molecules that are easily removed by the interaction with metastable atoms, the atoms of the passivating layer are desorbed in the regions struck by the metastable atoms, as depicted. The absence of the passivating atoms or molecules exposes the underlying substrate or support surface which can in turn be reacted with different atoms or molecules which arrive at the depassivated site. For example, the removal of a hydrogen passivating layer from a silicon substrate will leave portions of the underlying silicon substrate exposed, which can be oxidized by exposure to an oxygen source.

After patterned removal of the passivating layer, the depassivated surface pattern can be further processed by any number of techniques in which either other atoms or molecules, for example as depicted in FIG. 2, metals or oxygen, can be bonded to the depassivated sites. Otherwise, surface material can be removed from the depassivated sites, by some form of chemical or physical etching or removal process. For example, the exposure of a depassivated surface to oxygen or air may allow an oxide to be formed at the depassivated sites. According to another example, deposition of metal atoms on the surface can result in diffusion of the metal atoms over the non-reactive, passivated portion of the surface and bonding in the reactive, non-passivated sites, as depicted in FIG. 2. This process can be used to selectively form either metal or insulator areas or patterns on a surface.

It is noted that in instances in which the passivation layer itself is more reactive to chemical interaction or bonding than the underlying substrate, it is possible to selectively chemically bond and deposit material to portions of the substrate upon which the passivation layer remains after exposure to the metastable atoms.

According to the present invention, the patterning of a metastable atom beam can accomplished by any number of means, including the use of physical masks, atom diffraction, atom focusing, atom trapping, transport through holographically generated amplitude or phase gratings, etc. However, specific advantages can be obtained by using atom optical techniques. All the metastable rare gas atoms He, Ne, Ar, Kr and Xe are capable of being manipulated by radiation fields, including laser beams. In addition, Ne, Ar, Kr and Xe can be quenched with electromagnetic radiation, including lasers, allowing alternative ways of generating a pattern.

FIG. 3 is a schematic diagram which depicts an apparatus for performing metastable depassivation lithography according to one embodiment of the present invention. In FIG. 3 a metastable atom source 1 generates a beam 2 of metastable atoms and directs the beam 2 towards mask 3. If desired, a laser beam collimator 4 can be used to collimate the beam 2 of metastable atoms. The beam 2 of metastable atoms pass through mask 3 to form a pattern that is directed onto passivating layer 5 which is provided on substrate 6. The reaction of the metastable atoms on the passivating layer 5 is discussed above with reference to FIG. 1. In an alternative embodiment, the laser beam collimator 4 may be positioned between mask 3 and passivating layer 5, depending on the degree of collimation desired. In a further alternative embodiment, a Fresnel zone plate could be used to collimate the beam 2.

The metastable atoms can be produced using any conventional means. According to one embodiment of the present invention, metastable atoms were generated in a DC discharge flowing through a 0.1 mm nozzle at fluxes of up to $4 \times 10^{14}$ atoms·sr$^{-1}$·s$^{-1}$.

Figure 4:
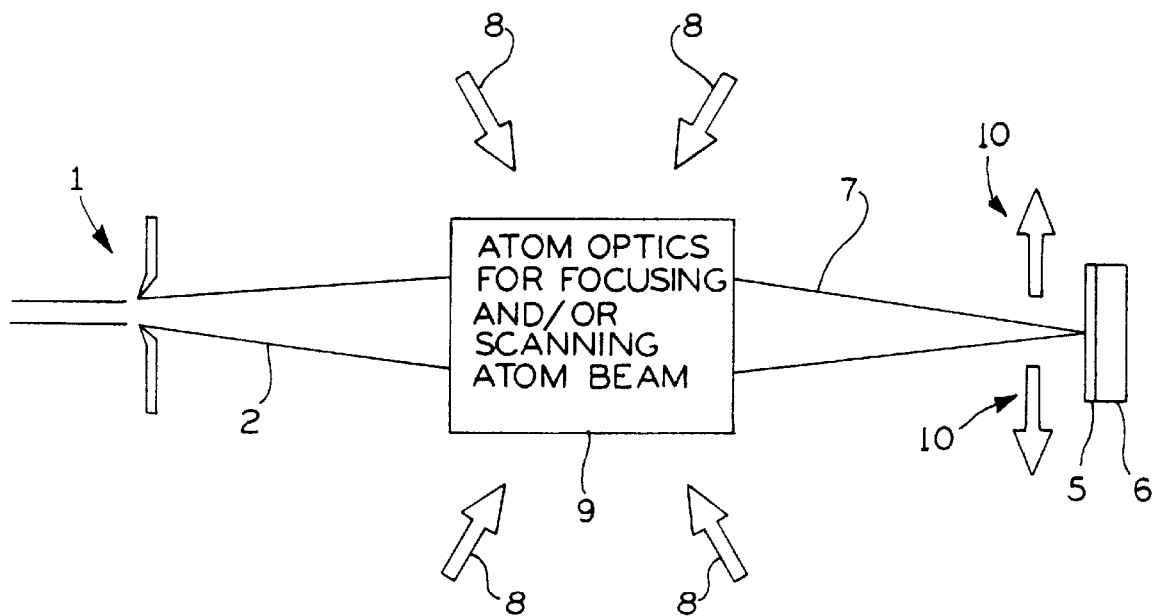
FIG. 4 is a schematic diagram which depicts an apparatus for preforming metastable depassivation lithography according to another embodiment of the present invention.

FIG. 4 is a schematic diagram which depicts an apparatus for performing metastable depassivation lithography according to another embodiment of the present invention. In FIG. 4 a metastable atom source 1 generates a beam 2 of metastable atoms that are directed toward substrate 6 which includes a passivating layer 5. In FIG. 4, the beam 2 of metastable atoms is focused and/or scanned by atom optics which are generally identified by reference numeral 9. The atom optics may include the use of standing laser beams 8 which are aligned so that their respective standing wave patterns collectively focus the beam 2 of metastable atoms in a desired pattern as indicated by reference numeral 7. In addition, or optionally, atom optical devices can be provided to cause the beam 2 or patterned beam 7 to be scanned over the passivating layer 5.

Other techniques for improving the performance of the metastable rare gas atom beams include, monochromization of the atom beam by laser cooling, creation of an "atomic funnel" to enhance the atom beam collimation and intensity, deep focusing of the atoms using a TEM$_{01}$ ("donut"-mode) laser beam to obtain spot sizes in the range of 1–3 nm. It is also possible to deflect the atom beam in order to modulate beam intensity. These are merely examples of known atom optic techniques which can be applied and used in conjunction with the present invention.

The use of metastable atoms according to the present invention is compatible with existing lithographic fabrication technologies. This allows for optimal use of conventional processes for low resolution, less demanding, patterned areas where appropriate, while at the same time providing the use of the present metastable exposure processes for the higher resolution areas. This "mix-and-match" approach allows greater flexibility and cost reduction in the fabrication of microdevices.

During the course of the present invention the atomic flux needed to desorb a certain area of surface was estimated, and compared with the brightness of currently available metastable sources. For purposes of this estimation and comparison the case of hydrogen-terminated Si with at least one metastable atom per hydrogen site strike was considered.

If the probability of desorption is taken as less than one, then more flux will be needed; however, given the metastable energy (10–21 eV) and the bond energy (–3 eV) the probability was expected to be at least a fair fraction of one. On average, these are $4 \times 10^{14}$ sites per cm$^2$, and one would need at least as many metastable atoms striking the surface. Because of the statistical nature of the metastable impact, it is desirable to have about a factor of 3 more than this to ensure that all sites get struck by at least one atom. Thus, it was determined that a total dose of at least $1.2 \times 10^{15}$ metastable atoms per cm$^2$ was needed.

A typical metastable atom source has an angular flux of about $1 \times 10^{14}$ atoms per steradian per second (T. J. Gay, "Sources of Metastable Atoms and Molecules." *Methods of Experimental Physics*, vol. 29B (Academic Press, 1995)). Thus after 1200 seconds, or 20 minutes, the necessary minimum dose can be achieved. It should be noted that this calculation is done assuming the atoms are not focused. If they are focused, the flux will be dramatically increased.

In addition to focusing the atoms, several things can be done to improve the flux if it is desirable to reduce the exposure time. The simplest approach is to move the sample closer to the source, which has the effect of increasing the flux as the inverse square of the distance. Another, more sophisticated approach involves laser manipulation of the metastable atoms to concentrate and capture more atoms as they leave the source. Laser cooling, in combination with magneto-optical devices, can be used in this respect, in some cases enhancing the intensity of a metastable beam by a factor as high as 1600 (M. Hoogerland, PhD Thesis, Technical University of Eindhoven (1993)).

The lithography techniques of the present invention have particular advantages over existing techniques. For example, conventional lithography has always been practiced utilizing damage from the kinetic energy of photons, electrons, or ions. This damage is generated in chemical polymer resists layers that are coated onto a surface and exposed to the photons, electrons or ions. After exposure, the damaged resist is removed, exposing the surface to an etching process. The present invention involves the use of internal energy from neutral Metastable atoms to chemically remove a bonded passivating atom from the surface. A different energy source is used and no resist is involved. Furthermore, the chemical processing used to build structures according to the present invention is quite different from conventional means because it relies on the chemical activity of the substrate.

In contrast to pattern generation on passivated surfaces with low energy electrons from a scanned-probe tip or scanned beam which has been proposed by N. Kramer et al (*J. Vac. Sci. Technol.* B 13, 805 (1995)), the mechanism which the present invention relies upon for removal of the passivating atoms is the energy (for bond breakage) which is provided from the internal excitation of a neutral atom, instead of from the kinetic energy of an electron.

Metastable atom lithography has been proposed by K. K. Bergrren et al. (*Science* 269, 1255 (1995)). A fundamental difference between metastable atom lithography and metastable depassivation lithography according to the present invention is that metastable atom lithography involves damaging a resist with Metastable atoms, while metastable depassivation lithography according to the present invention is based on the removal of a passivating layer. Typical resists used in metastable atom lithography are polymer formulations or self-assembled monolayers of alkanethiolates that are applied to the surface. In contrast, a passivating layer, as generally used in the industry, consists of single layer of atoms bonded to the surface to protect the underlying substrate from its ambient environment. In metastable atom lithography, the pattern resides in the damage effected to the resist. The damaged resist is subsequently developed (when required), and exposed to processes, e.g., etching, that transfer the pattern. In metastable depassivation lithography, the removal of a passivating layer exposes the substrate layer and thereby imprints the pattern. In these regions, the substrate atoms, e.g., silicon, which are generally highly reactive, can be reacted with gases, e.g., oxygen, or metals, e.g., aluminum, or use can be made of more traditional processes, e.g., etching, which operate differently on a passivated or depassivated substrate to establish the desired structures.

Other advantages in resolution of metastable depassivation lithography relative to other techniques, will be forthcoming because of the use of single atomic layers and elimination of charged particle scattering. Further advantages will be derived from being able to avoid a wet chemical processing of the substrate.

Features and characteristics of the present invention are demonstrated in the following example:

EXAMPLE 1

In this example a 10 mm×10 mm wafer of (100) silicon was hydorgen-passivated by dipping it in a solution of 49% hydrofluoric acid in water for 20 seconds. The wafer was then placed in a vacuum system and exposed to a dose of $3 \times 10^{15}$ metastable argon atoms per square centimeter through a shadow mask with 5 micrometer square holes. The depassivated areas were then oxidized by exposure to 1 atmosphere of oxygen gas for 10 minutes for a total dose of $10^{12}$ Langmuirs. The wafer was then removed from the vacuum and etched in a 0.1 mol solution of potassium hydroxide for 10 minutes. Examination with an atomic force microscope showed preferential etching of the regions exposed to the metastable argon atoms to a depth of approximately 7 nm, thus demonstrating the effectiveness metastable atom-induced depassivation of hydrogen passivated silicon.

Although the present invention has been described with reference to particular means, materials and embodiments, from the foregoing description, one skilled in the art can easily ascertain the essential characteristics of the present invention and various changes and modifications may be made to adapt the various uses and characteristics without departing from the spirit and scope of the present invention as described by the claims which follow.

What is claimed:

1. A process for fabricating structures on a surface of a substrate which comprises:

providing a passivating layer on a surface of a substrate; and directing a pattern of metastable atoms toward the substrate so that metastable atoms of the pattern induce desorption of the passivating layer on selected areas of a surface.

2. The process for fabricating structures on a surface of a substrate according to claim 1, further comprising effecting chemical bonding of a material on areas of the substrate where the passivating layer has been desorbed.

3. The process for fabricating structures on a surface of a substrate according to claim 1, further comprising:

effecting chemical bonding of a material on areas of the substrate wherein the passivating layer has not been desorbed by the metastable atoms.

4. The process for fabricating structures on a surface of a substrate according to claim 1, further comprising:

effecting chemical removal of a material on areas of the substrate where the passivating layer has been desorbed.

5. The process for fabricating structures on a surface of a substrate according to claim 1, further comprising:

effecting chemical removal of a material on areas of the substrate wherein the passivating layer has not been desorbed by the metastable atoms.

6. The process for fabricating structures on a surface of a substrate according to claim 1, wherein the pattern of the metastable atoms is produced by passing the metastable atoms through a mask.

7. The process for fabricating structures on a surface of a substrate according to claim 1, further comprising:

providing relative movement between the pattern of metastable atoms and the substrate.

8. The process for fabricating structures on a surface of a substrate according to claim 1, wherein the pattern of the metastable atoms is controlled by one or more lasers.

9. The process for fabricating structures on a surface of a substrate according to claim 1, further comprising:

controlling an internal energy state of the metastable atoms by one or more lasers.

10. The process for fabricating structures on a surface of a substrate according to claim 9, wherein the internal energy state of selected metastable atoms is quenched by the one or more lasers.

11. The process for fabricating structures on a surface of a substrate according to claim 1, wherein the pattern of metastable atoms is controlled by atom optical device comprising; a magnetic hexapole lens, a Fresnel lens, or an evanescent mirror.

12. The process for fabricating structures on a surface of a substrate according to claim 1, wherein the pattern comprises a plurality of sub-patterns.

13. The process for fabricating structures on a surface of a substrate according to claim 12, wherein the plurality of sub-patterns comprises identical shapes.

14. The process for fabricating structures on a surface of a substrate according to claim 1, in combination with optical lithography.

15. The process for fabricating structures on a surface of a substrate according to claim 1, in combination with electron beam lithography.

16. The process for fabricating structures on a surface of a substrate according to claim 1, in combination with ion beam lithography.

17. A process for selectively etching surface portions of a substrate which comprises:

providing a passivating layer on a surface of a substrate;

directing a pattern of metastable atoms toward the substrate so that metastable atoms of the pattern induce desorption of the passivating layer on selected areas of a surface and expose portions of the underlying substrate; and etching the exposed portions of the underlying substrate.

18. A method of fabricating a microdevice which comprises:

providing a substrate;

providing a passivating layer on a surface of the substrate;

directing a pattern of metastable atoms toward the substrate so that metastable atoms of the pattern induce desorption of the passivating layer on selected areas of a surface and expose selected portions of the underlying substrate which correspond to the pattern of the metastable atoms; and using the pattern of exposed portions of the underlying substrate to fabricate a microdevice.

19. The method according to claim 18, wherein the microdevice comprises a microelectronic device.

* * * * *